(12) United States Patent
Lin

(10) Patent No.: US 9,887,145 B2
(45) Date of Patent: Feb. 6, 2018

(54) METAL TOP STACKING PACKAGE STRUCTURE AND METHOD FOR MANUFACTURING THE SAME

(71) Applicant: Dawning Leading Technology Inc., Miao-Li County (TW)

(72) Inventor: Diann-Fang Lin, Miao-Li County (TW)

(73) Assignee: DAWNING LEADING TECHNOLOGY INC., Miao-Li County (TW)

( * ) Notice: Subject to any disclaimer, the term of this patent is extended or adjusted under 35 U.S.C. 154(b) by 87 days.

(21) Appl. No.: 14/678,278

(22) Filed: Apr. 3, 2015

(65) Prior Publication Data

US 2016/0293509 A1 Oct. 6, 2016

(51) Int. Cl.
| | | |
|---|---|---|
| H01L 23/10 | (2006.01) | |
| H01L 23/34 | (2006.01) | |
| H01L 23/043 | (2006.01) | |
| H01L 25/065 | (2006.01) | |
| H01L 25/00 | (2006.01) | |
| H01L 23/00 | (2006.01) | |
| H01L 23/367 | (2006.01) | |

(Continued)

(52) U.S. Cl.
CPC ............. *H01L 23/34* (2013.01); *H01L 23/04* (2013.01); *H01L 23/3675* (2013.01); *H01L 23/4334* (2013.01); *H01L 24/49* (2013.01); *H01L 24/85* (2013.01); *H01L 25/0657* (2013.01); *H01L 25/50* (2013.01); *H01L 23/24* (2013.01); *H01L 23/49816* (2013.01); *H01L 2224/73253* (2013.01); *H01L 2924/00014* (2013.01); *H01L 2924/167* (2013.01)

(58) Field of Classification Search
CPC ....... H01L 23/06; H01L 23/36; H01L 23/367; H01L 23/373; H01L 23/34; H01L 23/3675; H01L 23/3736; H01L 24/49; H01L 24/85; H01L 23/065; H01L 23/0657; H01L 2225/06528; H01L 23/06589; H01L 2924/167
USPC ....... 257/686, 712, 724, 708, 706, 707, 796, 257/E23.092
See application file for complete search history.

(56) References Cited

U.S. PATENT DOCUMENTS 6,720,647 B2 * 4/2004 Fukuizumi .......... H01L 23/3672
257/698
6,737,750 B1 * 5/2004 Hoffman ............. H01L 23/3128
257/777

(Continued)

*Primary Examiner* — Fernando L Toledo
*Assistant Examiner* — Aaron Gray
(74) *Attorney, Agent, or Firm* — Bacon & Thomas, PLLC

(57) ABSTRACT

A meal top stacking package structure and a method for manufacturing the same are provided, wherein the metal top stacking package structure includes a metal base including an upper surface and a lower surface, and a die receiver cavity formed in the upper surface; a first chip fixed on the die receiver cavity by a first adhesion layer; a substrate with an upper surface; a second chip fixed on the upper surface of the substrate by a second adhesion layer; and a plurality of connecting components formed on the upper surface of the substrate; wherein the upper surface of the metal base is connected with the substrate by the connecting components. Thereby, the structure and method can enhance heat dissipation and electromagnetic shield of the stacking package structure.

13 Claims, 4 Drawing Sheets

(51) Int. Cl.
*H01L 23/04* (2006.01)
*H01L 23/433* (2006.01)
*H01L 23/24* (2006.01)
*H01L 23/498* (2006.01)

(56) References Cited

U.S. PATENT DOCUMENTS

| | | | | |
|---|---|---|---|---|
| 8,704,349 | B2* | 4/2014 | Chow | H01L 21/561 |
| | | | | 257/686 |
| 2002/0050407 | A1* | 5/2002 | Sohn | H01L 23/3128 |
| | | | | 174/262 |
| 2003/0011054 | A1* | 1/2003 | Jeun | H01L 21/565 |
| | | | | 257/678 |
| 2003/0179549 | A1* | 9/2003 | Zhong | H01L 23/3128 |
| | | | | 361/707 |
| 2006/0091542 | A1* | 5/2006 | Zhao | H01L 21/565 |
| | | | | 257/738 |
| 2007/0090508 | A1* | 4/2007 | Lin | H01L 25/0657 |
| | | | | 257/686 |
| 2008/0150106 | A1* | 6/2008 | Pang Kuah | H01L 23/4334 |
| | | | | 257/676 |

* cited by examiner

METAL TOP STACKING PACKAGE STRUCTURE AND METHOD FOR MANUFACTURING THE SAME

BACKGROUND OF THE INVENTION

1. Field of the Invention

The present invention relates to a semiconductor chip package structure and a method for manufacturing the same, and more particularly to a metal top stacking package structure and a method for manufacturing the same.

2. Description of Related Art

A multichip package (MCP) structure is a package with a plurality of semiconductor chips integrated into a single package structure, so that density of electronic components is enhanced to shorten the electrical connecting channels between electronic components. This package not only reduces the overall size of the multichip but also enhances overall performance.

In conventional multichip package structure, a plurality of chips are stacked vertically, alternately, stepwise or otherwise, and then each of the chips is electrically connected to a substrate through wire bonding. In multi-semiconductor chips stacking package technology, a stacking package technology of multichip with same size is a conventional package technology.

In the known technology, please refer to FIG. 1, a thermally and electrically enhanced stacked semiconductor package 1 is provided. The semiconductor package 1 mainly comprises a chip carrier 11 used for electrically connecting the semiconductor package 1 to the external components; at least one second chip 12 is mounted on and electrically connected to the chip carrier 11 by a flip chip type; a heat sink 13 mounded over the first chip 12 and electrical connecting with the chip carrier 11; a conductive layer 14 and at least one second chip 15 electrical connecting with the working surface of the chip carrier 11 by electrically connecting wires and mounded on the non-working surface; a plurality of wires 16 and an encapsulate material 17 are formed on the chip carrier 11 and encapsulating the first chip 12, the second chip 15, the heat sink 13 and the other components, and partly the chip carrier 11.

However, as shown in FIG. 1, the heat sink between the first chip and the second chip cannot achieve the ideal effect in heat dissipation and electromagnetic shielding; therefore, the heat energy during the working chips cannot effectively dissipate from the package, thereby reducing the chip stability and life time. Therefore, there is an urgent need for a metal top stacking package structure and a method for manufacturing the same, which provides heat dissipation and electromagnetic shielding by an optimum installation of the metal top; thereby enhancing electrical connection quality and life time of the chips.

SUMMARY OF THE INVENTION

An object of the present invention is to provide a metal top stacking package structure, which the heat dissipation and the electromagnetic shielding can be provided by using an installation of the metal top. Therefore, it can be prevented working chips from malfunctioning and damaging.

To achieve the above object, the present invention provides a metal top stacking package structure, comprising a metal base including an upper surface and a lower surface, and a die receiver cavity formed in the upper surface; a first chip fixed on the die receiver cavity by a first adhesion layer; a substrate with an upper surface; a second chip fixed on the upper surface of the substrate by a second adhesion layer; and a plurality of connecting components formed on the upper surface of the substrate; wherein the upper surface of the metal base is connected with the substrate by the connecting components.

In the metal top stacking package structure of the present invention, the structure may further comprise a plurality of electrically connecting wires including first electrically connecting wires and second electrically connecting wires. An installation of these electrically connecting wires may be randomly varied based on stacking package conditions or the user's requirements; wherein a plurality of the first electrically connecting wires can be coupled the first chip with the metal base. Further, a plurality of the second electrically connecting wires may be coupled the second chip with the substrate. Besides, in the metal top stacking package structure of the present invention, an order of wire bonding may be randomly varied based on stacking package conditions or the user's requirements; wherein the wire bonding between the first chip and the metal base may be firstly performed, and then a wire bonding between the second chip and the substrate may be performed; alternatively, a wire bonding between the second chip and the substrate may be firstly performed, and then the wire bonding between the first chip and the metal base may be performed.

In the metal top stacking package structure of the present invention, the metal top stacking package structure may further comprise a heat sink formed on the lower surface of the metal base; wherein the heat sink may be a heat spreader, a heat pipe or a fan, but the present invention is not limited thereto. In an aspect of the present invention, the heat sink may be a heat spreader, and the material of the heat spreader is a copper material. The heat energy during the working chips may be dissipated to the other semiconductor chips or the metal base by the heat sink.

In the metal top stacking package structure of the present invention, the upper surface of the substrate may further comprise a metal layer; wherein the material of the metal layer may be randomly varied based on stacking package conditions or the user's requirements, and the material of the metal layer may be a magnesium alloy, an aluminum alloy, a copper alloy, a ferrous alloy, magnesium copper alloy or combinations thereof, but the present invention is not limited thereto. In an aspect of the present invention, the material of the metal layer may be magnesium alloy, and in another aspect of the present invention, the material of the metal layer may be copper alloy.

In the metal top stacking package structure of the present invention, the metal top stacking package structure may further comprise a first encapsulate material formed on the substrate and surrounding the metal base, the first chip, the second chip, the first adhesion layer, the second adhesion layer, the first electrically connecting wires, the second electrically connecting wires and the connecting components; wherein the lower surface of the metal base may be exposed.

In the metal top stacking package structure of the present invention, the metal top stacking package structure may further comprise a second encapsulate material formed in the receiver cavity of the metal base and surrounding the first chip, the first adhesion layer and the first electrically connecting wires. In the metal top stacking package structure of the present invention, the first encapsulate material and the second encapsulate material may be the same; the first encapsulate material and the second encapsulate material may be components selected from the group consisting of epoxy resin, ceramic powders, carbon black, but the present invention is not limited thereto.

Besides, another object of the present invention is to provide a method for manufacturing metal top stacking package structure, comprising: providing a metal base including a upper surface and a lower surface, and a die receiver cavity formed in the upper surface; forming a first adhesion layer on the die receiver cavity of the upper surface; fixing a first chip to the die receiver cavity of the upper surface by the first adhesion layer; providing a substrate with an upper surface; fixing a second chip to the upper surface of the substrate by the second adhesion layer; and a plurality of connecting components formed on the upper surface of the substrate; wherein the upper surface of the metal base may be connected with the substrate by the connecting components.

In the method for manufacturing metal top stacking package structure, the method may further comprise a plurality of first electrically connecting wires coupled the first chip with the metal base to input and output signals. Further, the method may further a plurality of second electrically connecting wires coupled the second chip with the substrate to input and output signals. Besides, in the method for manufacturing metal top stacking package structure, an order of wire bonding may be randomly varied based on stacking package conditions or the user's requirements; wherein the wire bonding between the first chip and the metal base can be firstly performed, and then a wire bonding between the second chip and the substrate can be performed; alternatively, a wire bonding between the second chip and the substrate can be firstly performed, and then the wire bonding between the first chip and the metal base can be performed.

In the method for manufacturing metal top stacking package structure, the method may further comprise a heat sink formed on the lower surface of the metal base; wherein the heat sink may be a heat spreader, a heat pipe or a fan, but the present invention is not limited thereto. In an aspect of the present invention, the heat sink may be a heat spreader.

In the method for manufacturing metal top stacking package structure, the method may further comprise a metal layer may be formed on the upper surface of the substrate; wherein the material of the metal layer may be randomly varied based on stacking package conditions or the user's requirements, and the material of the metal layer may be a magnesium alloy, an aluminum alloy, a copper alloy, a ferrous alloy, magnesium copper alloy or combinations thereof, but the present invention is not limited thereto. In an aspect of the present invention, the material of the metal layer may be magnesium alloy, and in another aspect of the present invention, the material of the metal layer may be copper alloy.

In the method for manufacturing metal top stacking package structure, the method may further comprise a first encapsulate material formed on the substrate and surrounding the metal base, the first chip, the second chip, the first adhesion layer, the second adhesion layer, the first electrically connecting wires, the second electrically connecting wires, and the connecting components; wherein the lower surface of the metal base may be exposed.

In the method for manufacturing metal top stacking package structure, the method may further comprise a second encapsulate material formed in the die receiver cavity of the metal base and surrounding the first chip, the first adhesion layer and the first electrically connecting wires. In the metal top stacking package structure of the present invention, the first encapsulate material and the second encapsulate material may be the same; and the first encapsulate material and the second encapsulate material may be components selected from the group consisting of epoxy resin, ceramic powders, carbon black, but the present invention is not limited thereto.

Therefore, the effects of the present invention are enhancement of heat dissipation and electromagnetic shielding of the stacking package structure, thereby enhancing the stability and life time of the chips. To sum up, the technical features of the present invention is the metal base mounted over the first chip and the second chip to provide optimum effects in heat dissipation and electromagnetic shielding, thereby enhancing the stability of the package structure. Furthermore, a heat sink of the present invention can be directly formed on the lower surface of the metal base to enhance the heat dissipation of the package structure. Besides, the metal layer of the present invention can be formed on the substrate to provide a preferable electromagnetic shielding to avoid interference of magnetic field and enhance the stability of the package structure.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Hereinafter, the actions and the effects of the present invention will be explained in more detail via specific examples of the invention. However, these examples are merely illustrative of the present invention and the scope of the invention should not be construed to be defined thereby.

Example 1

Figure 1:
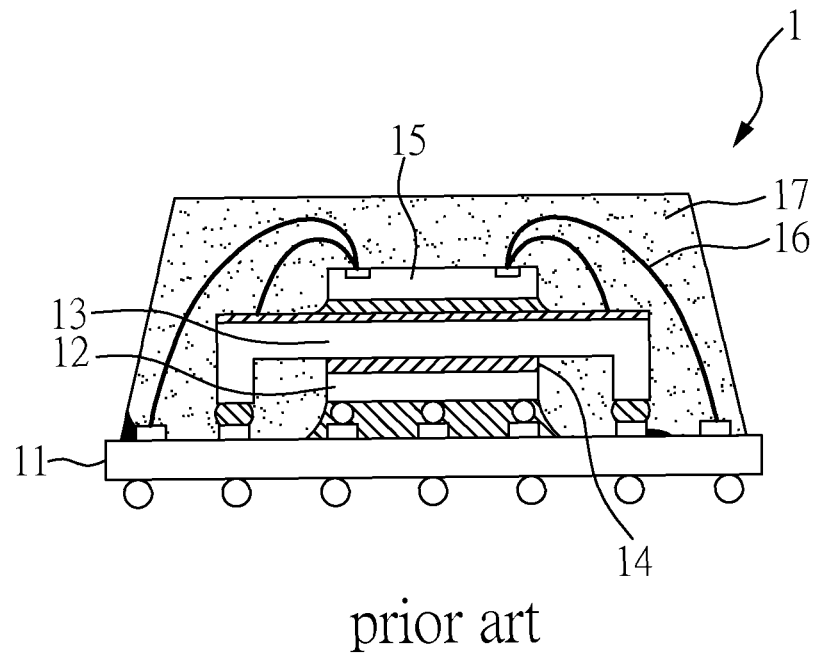
FIG. 1 shows a sectional schematic diagram of a conventional multichip stacking package structure.
Figure 2:
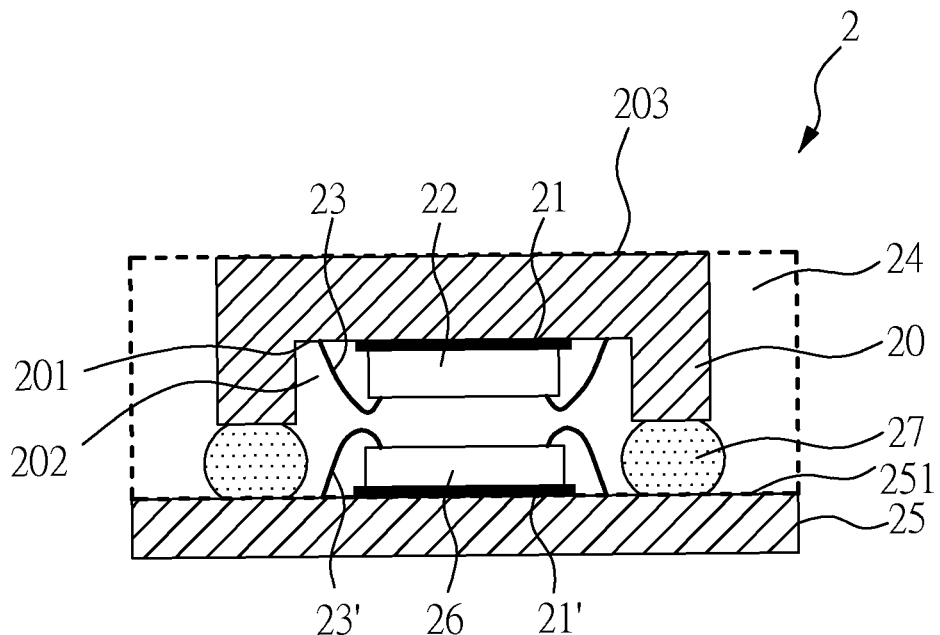
FIG. 2 shows a sectional schematic diagram of a metal top stacking package structure according to Example 1 of the present invention.
Figure 3A:
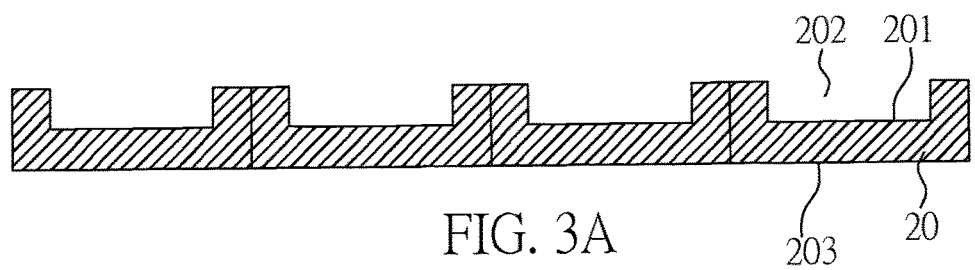
FIG. 3A~3H show a process flow schematic diagram of a metal top stacking package structure according to Example 1 of the present invention.
Figure 3B:
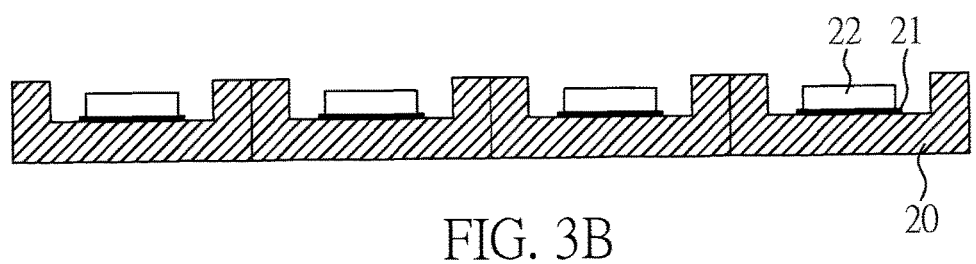
Figure 3C:
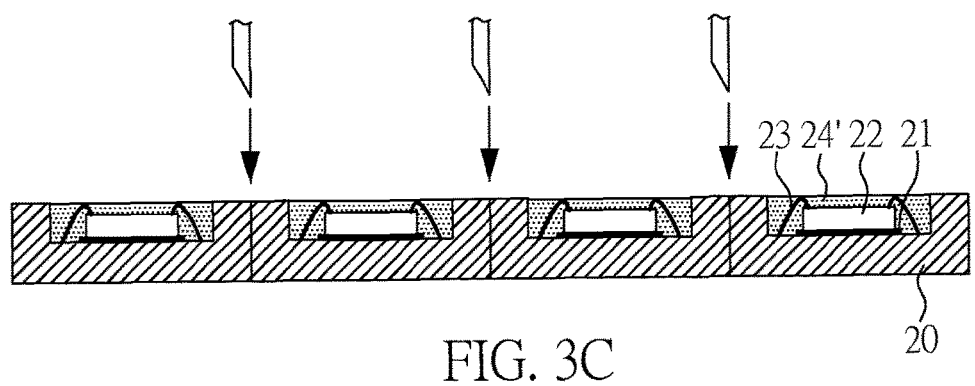
Figure 3D:
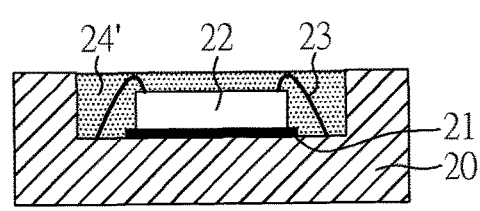
Figure 3E:
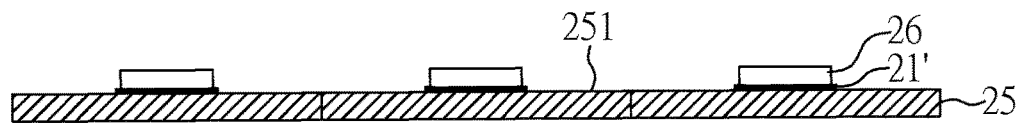
Figure 3F:
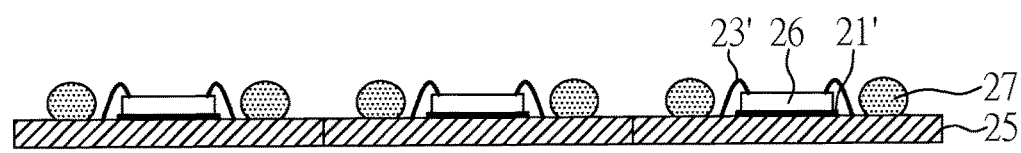
Figure 3G:
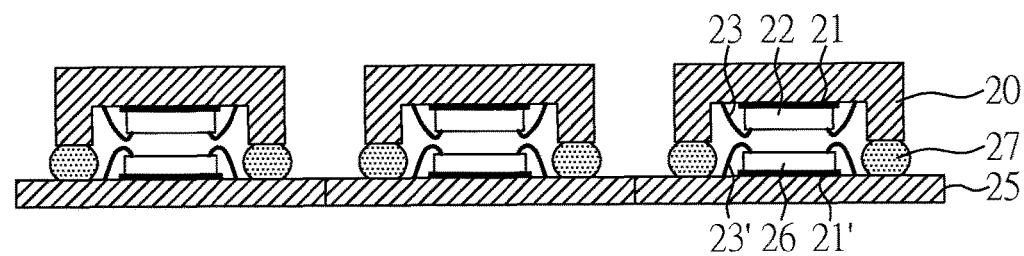
Figure 3H:
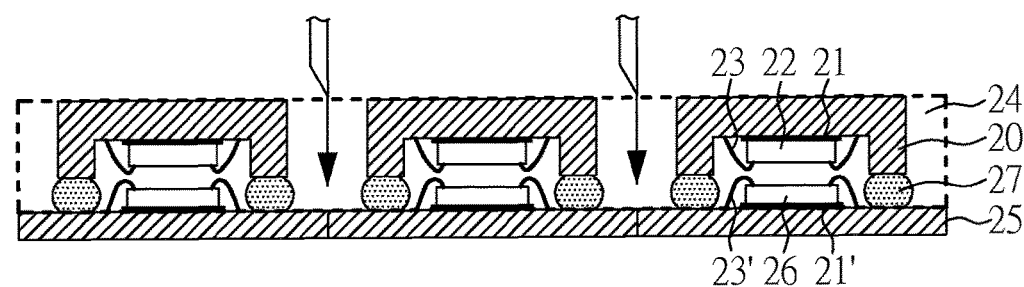

Please refer to FIG. 3, FIG. 3 shows a process flow schematic diagram of a metal top stacking package structure according to Example 1 of the present invention; and please refer to FIG. 2, FIG. 2 shows a sectional schematic diagram of a metal top stacking package structure according to Example 1 of the present invention. Please refer to FIG. 3A, first, a metal base 20 including an upper surface 201 and a lower surface 203 is provided, and a plurality of die receiver cavities 202 are formed in the upper surface 201. Secondly, please refer to FIG. 3B, a plurality of first chips 22 are fixed on these die receiver cavities 202 by a plurality of the first adhesion layers 21. Please refer to FIG. 3C, these first chips 22 are electrically connected with the metal base 20 by a plurality of first electrically connecting wires 23 to input and output signals. Further, a second encapsulate material 24' is formed in these die receiver cavities 202 of the metal base 20 and surrounds these first adhesion layers 21, these first chips 22 and these first electrically connecting wires 23. Moreover, these die receiver cavities 202 are cut, as shown in FIG. 3D. Further, please refer to FIG. 3E, a substrate with an upper surface 251 is provided, and a plurality of second chips 26 are fixed on the upper surface 251 of the substrate 25 by a plurality of the second adhesion layers 21'. Besides, please refer to FIG. 3F, these second chips 26 are electrically connected to the substrate 25 by a plurality of the second electrically connecting wires 23' to input and output signals; and a plurality of connecting components 27 are formed on the upper surface 251 of the substrate 25. Then please refer to FIG. 3G, the upper surface 201 of the metal bases 20 is connected with the substrate 25 by these connecting components 27. Finally, please refer to FIG. 3H, a first encapsulate material 24 is formed on the substrate 25 and surrounds the metal base 20, these first adhesion layers 21, these second adhesion layers 21', these first chips 22, these second chips 26, these first electrically connecting wires 23, these second electrically connecting wires 23' and these connecting components 27, and the lower surface of the metal base is exposed.

Example 2

The metal top stacking package structure of Example 2 of the present invention is substantially the same as the above Example 1, except that the second encapsulate material 24' is formed in the receiver cavity of the metal base and surrounds these first adhesion layers, these first chips and these first electrically connecting wires, and the first encapsulate material is formed on the substrate and surrounds the metal base, the first chip, the second chip, the first adhesion layer, the second adhesion layer, the first electrically connecting wires, the second electrically connecting wires, and the connecting components; wherein the lower surface of the metal base is exposed in Example 1 of the present invention. However, in Example 2 of the present invention, the first encapsulate material is formed on the substrate and surrounds the metal base, these first adhesion layers, these second adhesion layers, these first chips, these second chips, these first electrically connecting wires, these second electrically connecting wires and these connecting components after the metal base is electrically connected with the substrate; wherein the lower surface of the metal base is exposed. Namely, Example 1 of the present invention includes the first encapsulate material 24 and the second encapsulate material 24', but Example 2 of the present invention only includes the first encapsulate material 24 to simplify processes and reduce manufacturing cost.

Example 3

The metal top stacking package structure of Example 3 of the present invention is substantially the same as the above Example 1, except that the lower surface of the metal base of Example 1 is without any component, but the lower surfaces of the metal bases of Example 3 have a heat sink. The heat sink is directly formed on the lower surface of the metal base in Example 3 to enhance heat dissipation of the package structure. Further, the heat sink in Example 3 is a heat spreader, and the material of the heat spreader is a copper material. The heat energy during the working chips is dissipated to the other semiconductor chips or the metal base by the heat sink Example 4

The metal top stacking package structure of Example 4 of the present invention is substantially the same as the above Example 1, except that the second adhesion layers are formed on the substrate in Example 1, but the metal layers are formed on the substrate and then the second adhesion layers are formed in Example 4. Further, the materials of the metal layers may be randomly varied based on stacking package conditions and the user's requirements, and the materials of the metal layer can be a magnesium alloy, an aluminum alloy, a copper alloy, a ferrous alloy, magnesium copper alloy or combinations thereof. Therefore, the package structure has a preferable electromagnetic shielding because of the metal layer, and avoids interference of magnetic field to enhance the stability of the package structure.

Example 5

Figure 4:
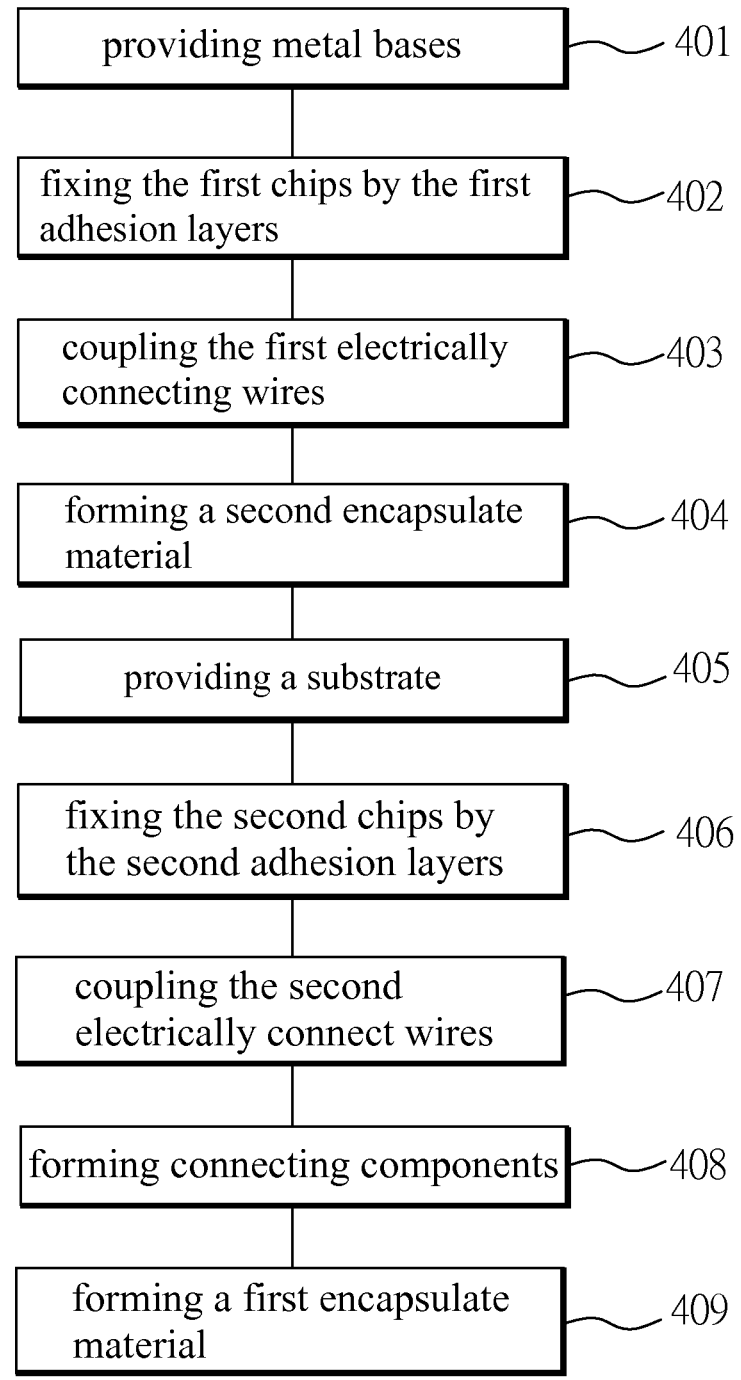
FIG. 4 shows a flow diagram of a method for manufacturing the metal top stacking package structure according to Example 5 of the present invention.

Please refer to FIG. 4, FIG. 4 shows a flow diagram of a method for manufacturing the metal top stacking package structure according to Example 5 of the present invention. First, as shown in step 401, a metal base including an upper surface and a lower surface is provided, and a plurality of die receiver cavities are formed in the upper surface. Second, as shown in step 402, a plurality of first chips are fixed on these die receiver cavities by a plurality of first adhesion layers. Further, as shown in step 403, a plurality of the first electrically connecting wires are coupled these first chips with these metal base; and as shown in step 404, a second encapsulate material formed in these receiver cavities of the metal base and surrounds these first chips, these first adhesion layers, and the first electrically connecting wires. Besides, as shown in step 405, a substrate with an upper surface is provided; as shown in step 406, a plurality of second chips are fixed on the upper surface of the substrate by a plurality of second adhesion layers. Furthermore, as shown in step 407, a plurality of second electrically connecting wires are coupled these second chips with the substrate; as shown in step 408, a plurality of connecting components are formed on the upper surface of the substrate, and the upper surface of the metal base connects with the substrate by the connecting components. Finally, as shown in step 409, a first encapsulate material is formed on the substrate and surrounds the metal base, these first adhesion layers, these second adhesion layers, these first chips, these second chips, these first electrically connecting wires, these second electrically connecting wires, the substrate, and the connecting components, and the lower surface of the metal base is exposed.

In the metal top stacking package structure and the method for manufacturing the same, the metal base is formed over the first chip and the second chip to provide preferable electromagnetic shielding and the heat dissipation, thereby enhancing stability of the package structure. The heat sink of the present invention can be directly formed on the lower surface of metal base to enhance heat dissipation of the package structure. Besides, the metal layer can be formed on the substrate according to actual product properties to provide preferable electromagnetic shielding and avoid interference of external magnetic field.

It should be understood that these examples are merely illustrative of the present invention and the scope of the invention should not be construed to be defined thereby, and the scope of the present invention will be limited only by the appended claims.

What is claimed is:
1. A metal top stacking package structure, comprising:
    a metal base including an upper surface and a lower surface, and a die receiver cavity formed in the upper surface;

a first chip fixed on the die receiver cavity by a first adhesion layer;
a substrate with an upper surface;
a second chip fixed on the upper surface of the substrate by a second adhesion layer, wherein the second chip is located outside the die receiver cavity; and
a plurality of connecting components formed on the upper surface of the substrate;
wherein the upper surface of the metal base is connected with the substrate by the connecting components, and wherein a first encapsulate material is formed on the substrate to surround the second chip, and a second encapsulate material is formed in the die receiver cavity of the metal base to surround the first chip and not protruding from the die receiver cavity,
wherein the metal top stacking package structure further comprises a plurality of first electrically connecting wires which are accommodated inside the die receiver cavity and coupling the first chip with the metal base, and wherein the second chip is directly below the first chip.

2. The metal top stacking package structure of claim 1, further comprises a plurality of second electrically connecting wires coupling the second chip with the substrate.

3. The metal top stacking package structure of claim 1, further comprises a heat sink formed on the lower surface of the metal base.

4. The metal top stacking package structure of claim 1, wherein the upper surface of the substrate further comprises a metal layer.

5. The metal top stacking package structure of claim 2, wherein the first encapsulate material is further surrounding the metal base, the second adhesion layer, the second electrically connecting wires, and the connecting components; and the lower surface of the metal base is exposed.

6. The metal top stacking package structure of claim 1, wherein the second encapsulate material is further surrounding the first adhesion layer and the first electrically connecting wires.

7. The metal top stacking package structure of claim 6, wherein the first encapsulate material and the second encapsulate material are the same.

8. A method for manufacturing metal top stacking package structure, comprising:
providing a metal base including an upper surface and a lower surface, and a die receiver cavity formed in the upper surface;
forming a first adhesion layer on the die receiver cavity of the upper surface;
fixing a first chip to the die receiver cavity of the upper surface by the first adhesion layer;
providing a substrate with an upper surface;
fixing a second chip to the upper surface of the substrate by a second adhesion layer, wherein the second chip is located outside the die receiver cavity; and
a plurality of connecting components formed on the upper surface of the substrate;
wherein the upper surface of the metal base is connected with the substrate by the connecting components, and a first encapsulate material is formed on the substrate to surround the second chip after the upper surface of the metal base is connected with the substrate, and a second encapsulate material is formed in the die receiver cavity of the metal base to surround the first chip before the upper surface of the metal base is connected with the substrate,
wherein the second encapsulate material is not protruding from the die receiver cavity, and a plurality of first electrically connecting wires are accommodated inside the die receiver cavity and coupling the first chip with the metal base.

9. The method for manufacturing metal top stacking package structure of claim 8, further comprises a plurality of second electrically connecting wires coupling the second chip with the substrate.

10. The method for manufacturing metal top stacking package structure of claim 8, further comprises a heat sink formed on the lower surface of the metal base.

11. The method for manufacturing metal top stacking package structure of claim 8, further comprises a metal layer formed on the upper surface of the substrate.

12. The method for manufacturing metal top stacking package structure of claim 9, wherein the first encapsulate material is further surrounding the metal base, the second adhesion layer, the second electrically connecting wires, and the connecting components; and the lower surface of the metal base is exposed.

13. The method for manufacturing metal top stacking package structure of claim 8, wherein the second encapsulate material is further surrounding the first adhesion layer and the first electrically connecting wires.

* * * * *